United States Patent
Li et al.

(10) Patent No.: US 11,985,764 B2
(45) Date of Patent: May 14, 2024

(54) CIRCUIT BOARD AND METHOD FOR MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Yang Li, Guangdong (CN); Yan-Lu Li, Shenzhen (CN); Li-Kun Liu, Shenzhen (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 269 days.

(21) Appl. No.: 17/727,935

(22) Filed: Apr. 25, 2022

(65) Prior Publication Data
US 2022/0248535 A1    Aug. 4, 2022

Related U.S. Application Data

(63) Continuation-in-part of application No. PCT/CN2020/086739, filed on Apr. 24, 2020.

(51) Int. Cl.
*H05K 1/14* (2006.01)
*H05K 3/38* (2006.01)
*H05K 9/00* (2006.01)

(52) U.S. Cl.
CPC ............. *H05K 1/147* (2013.01); *H05K 3/388* (2013.01); *H05K 9/0088* (2013.01)

(58) Field of Classification Search
CPC ....... H05K 1/147; H05K 3/388; H05K 9/0088
USPC ......................................................... 361/748
See application file for complete search history.

(56) References Cited

U.S. PATENT DOCUMENTS

| 9,769,967 | B2 | 9/2017 | Chi et al. | |
|---|---|---|---|---|
| 2014/0071101 | A1* | 3/2014 | Kim | G06F 3/041 |
| | | | | 361/679.01 |
| 2015/0227248 | A1* | 8/2015 | Yamazaki | G06F 3/147 |
| | | | | 361/679.01 |

FOREIGN PATENT DOCUMENTS

| CN | 1744795 A | 3/2006 |
|---|---|---|
| TW | 200806097 A | 1/2008 |
| TW | 201935575 A | 9/2019 |

* cited by examiner

*Primary Examiner* — Andargie M Aychillhum
(74) *Attorney, Agent, or Firm* — ScienBiziP, P.C.

(57) ABSTRACT

A circuit board, with inbuilt protection against incoming and outgoing electromagnetic interference (EMI), includes an insulating adhesive portion, a first signal line, and a second signal line. The first signal line and the second signal line are surrounded and separated by an electromagnetic shielding film against EMI. The insulating adhesive portion fills a gap between the first signal line and the electromagnetic shielding film and a gap between the second signal line and the electromagnetic shielding film. External interference with signals in the circuit board is reduced, mutual interference between the first signal line and the second signal line is reduced, and electromagnetic radiation of the circuit board is also reduced. A method for manufacturing the circuit board is also disclosed.

19 Claims, 9 Drawing Sheets

1 — Providing a circuit substrate, the circuit substrate comprising a circuit layer, a dielectric layer, and a metal layer stacked in sequence, a surface of the dielectric layer facing away from the metal layer being a first surface, a surface of the metal layer facing away from the dielectric layer being a second surface; the circuit layer comprising a first signal line and a second signal line spaced from each other along a first direction, the first surface comprising an intermediate area, the intermediate area disposed between the first signal line and the second signal line, and the intermediate area spaced apart from the first signal line and the second signal line 2 — Disposing an insulating adhesive layer on the first surface except for the intermediate area to form an intermediate structure; along the first direction, the intermediate structure comprising a first area on a side of the intermediate area away from the second signal line and a second area on a side of the intermediate area away from the first signal line 3 — Bending the first area and the second area with the metal layer facing outward, so that an end of the first area and an end of the second area are connected to the intermediate area, the metal layer surrounding the first signal line and the second signal line to respectively form a first shielding structure and a second shielding structure 4 — Disposing an adhesive layer between the bent first area and the bent second area to bond the first area and the second area together 5 — Pressing the intermediate structure to obtain the circuit board

CIRCUIT BOARD AND METHOD FOR MANUFACTURING THE SAME

The subject matter herein generally relates to circuit boards, and more particularly, to a circuit board and a method for manufacturing the circuit board.

BACKGROUND 5G antennas are used in electronic devices (such as 5G phones) that require high-frequency and high-speed signal transmission. Protection against electromagnetic interference during the signal transmission needs to be improved. Therefore, there is a room for improvement in the art.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict exists, the following embodiments and features in the embodiments can be combined with each other.

Figure 12:
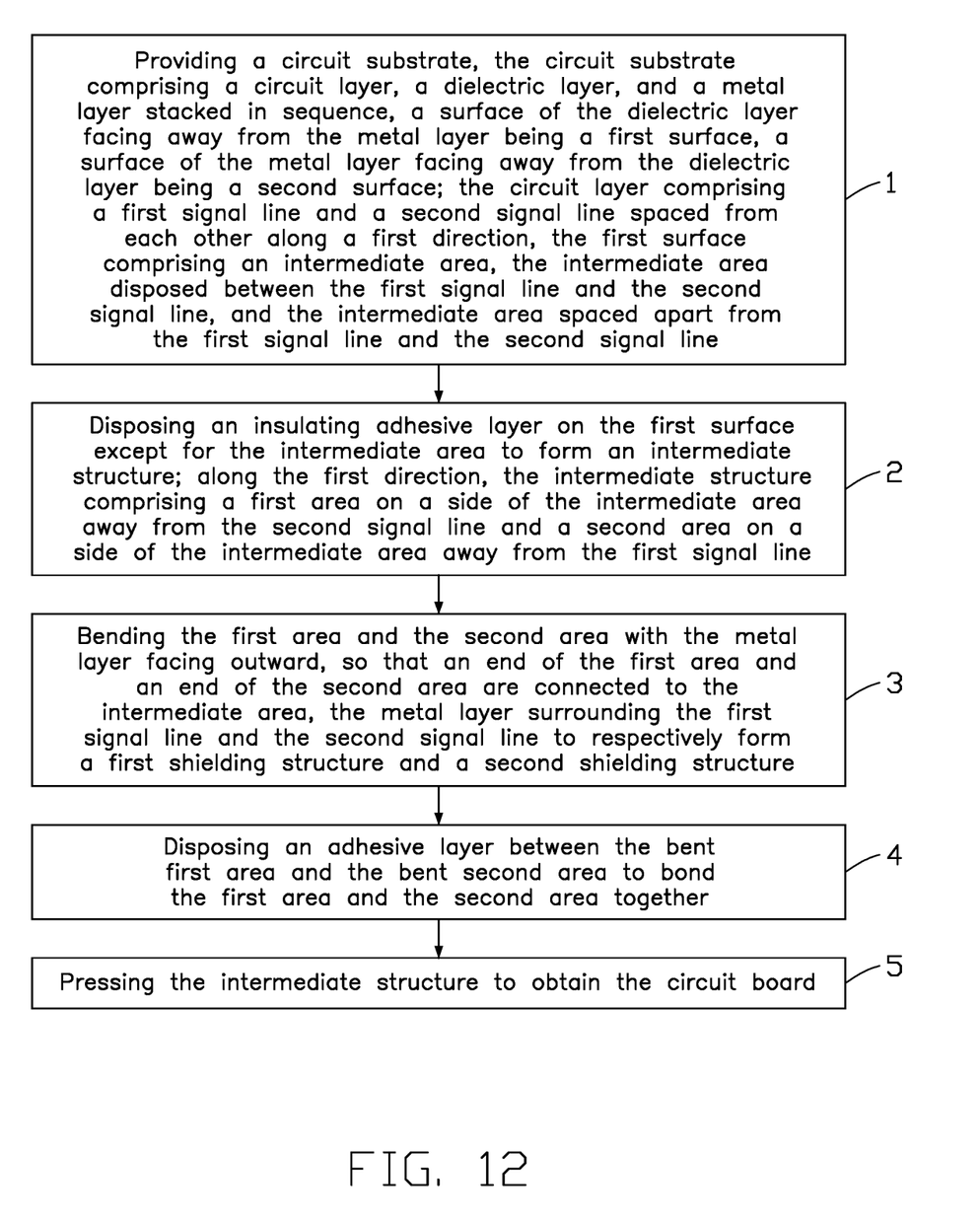
FIG. 12 is a flowchart of an embodiment of a method for manufacturing a circuit board according to the present disclosure.

Referring to FIG. 12, a method for manufacturing a circuit board 100 is provided in accordance with an embodiment. The method is provided by way of example, as there are a variety of ways to carry out the method. Referring to FIG. 12, the method can begin at block 1.

Figure 1:
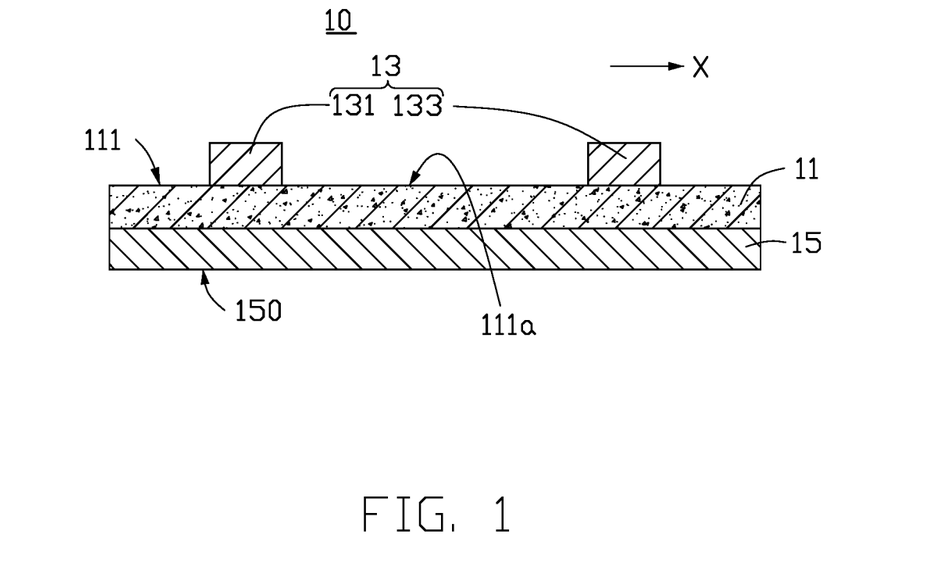
FIG. 1 is a cross-sectional view of an embodiment of a circuit substrate according to the present disclosure.

In block 1, referring to FIG. 1, a circuit substrate 10 is provided. The circuit substrate 10 includes a circuit layer 13, a dielectric layer 11, and a metal layer 15 stacked in sequence. A surface of the dielectric layer 11 facing away from the metal layer 15 is defined as a first surface 111. A surface of the metal layer 15 facing away from the dielectric layer 11 is defined as a second surface 150. The circuit layer 13 includes a first signal line 131 and a second signal line 133 spaced from each other along a first direction X. The first surface 111 includes an intermediate area 111a. The intermediate area 111a is disposed between the first signal line 131 and the second signal line 133. The intermediate area 111a is spaced apart from the first signal line 131 and the second signal line 133.

The dielectric layer 11 can be made of polyimide (PI), liquid crystal polymer (LCP), polyethylene terephthalate (PET), or polyethylene naphthalate (PEN). In the embodiment, the dielectric layer 11 is made of polyimide.

The metal layer 15 can be made of copper, silver, nickel, gold, or their alloys.

In the embodiment, the circuit substrate 10 is made from a double-sided copper-clad board.

Figure 2:
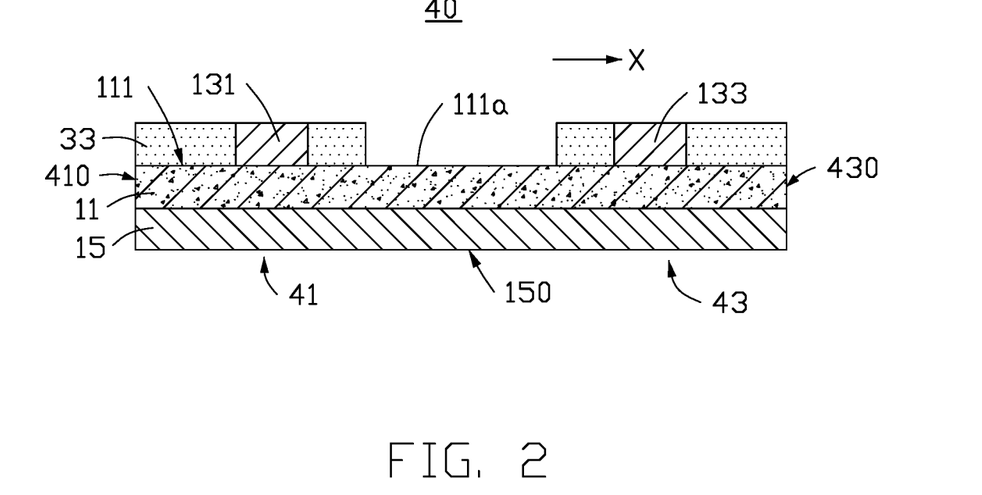
FIG. 2 is a cross-sectional view showing an insulating adhesive layer disposed on the circuit substrate of FIG. 1 to form an intermediate structure.

In block 2, referring to FIG. 2, an insulating adhesive layer 33 is disposed on the first surface 111 except for the intermediate area 111a to form an intermediate structure 40. Along the first direction X, the intermediate structure 40 includes a first area 41 on a side of the intermediate area 111a away from the second signal line 133 and a second area 43 on a side of the intermediate area 111a away from the first signal line 131. The first area 41 includes a first end 410 facing away from the second signal line 133. The second area 43 includes a second end 430 facing away from the first signal line 131.

The insulating adhesive layer 33 can be made of at least one of polypropylene, epoxy resin, polyurethane, phenolic resin, urea-formaldehyde resin, melamine-formaldehyde resin, polyimide, and the like.

Figure 3:
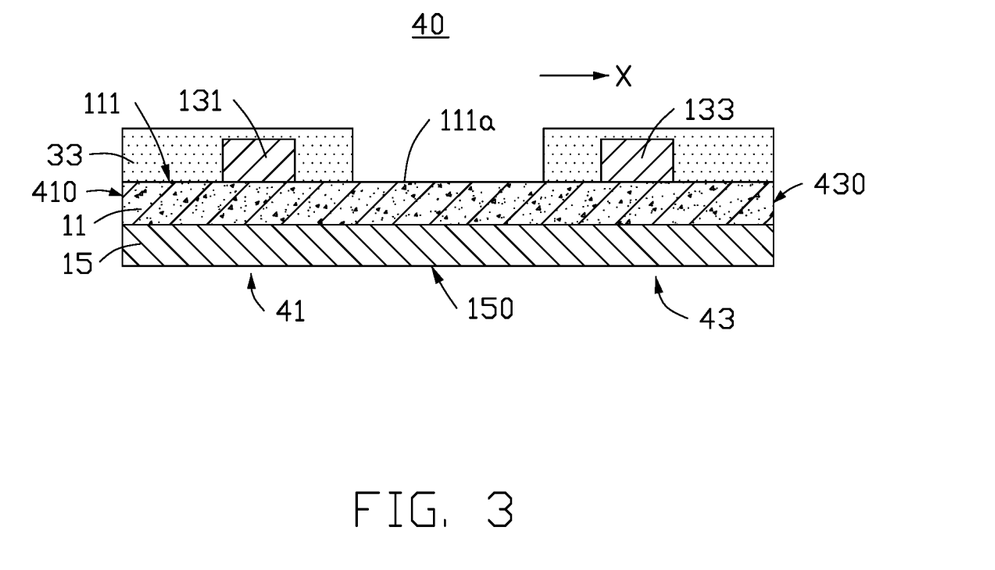
FIG. 3 is a cross-sectional view of another embodiment of a circuit substrate according to the present disclosure.

In the embodiment, as shown in FIG. 2, the insulating adhesive layer 33 does not cover both surfaces of the first signal line 131 and the second signal line 133 facing away from the dielectric layer 11. In some embodiments, the insulating adhesive layer 33 further covers at least one of the surfaces of the first signal line 131 and the second signal line 133 facing away from the dielectric layer 11. For example, referring to FIG. 3, the insulating adhesive layer 33 covers both the surfaces of the first signal line 131 and the second signal line 133 facing away from the dielectric layer 11.

Figure 4:
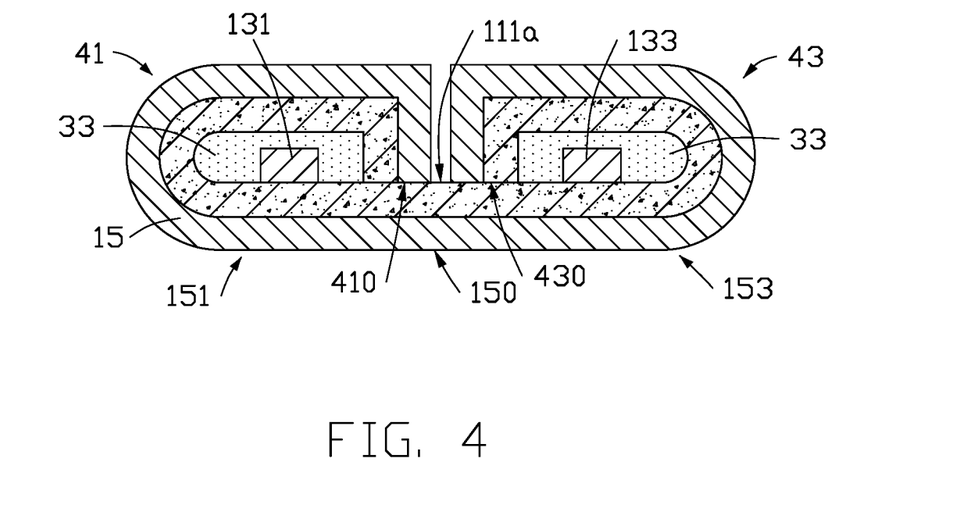
FIG. 4 is a cross-sectional view of the intermediate structure of FIG. 2 after being bent.
Figure 5:
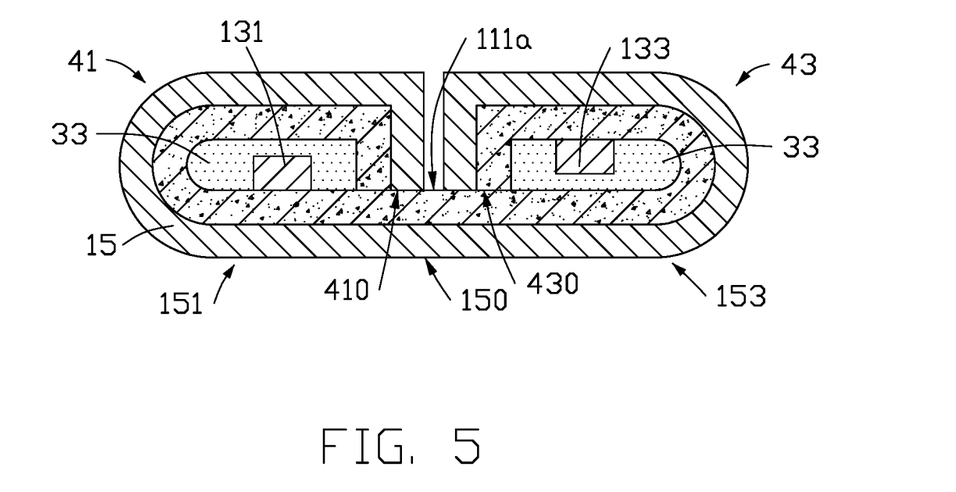
FIG. 5 is a cross-sectional view of another embodiment of an intermediate structure after being bent.

In block 3, referring to FIGS. 4 and 5, the first area 41 and the second area 43 of the intermediate structure 40 are bent, with the metal layer 15 facing outward, so that the first end 410 and the second end 430 are connected to the intermediate area 111a. Thus, the metal layer 15 surrounds the first signal line 131 and the second signal line 133 to respectively form a first shielding structure 151 and a second shielding structure 153.

Two opposite surfaces of the insulating adhesive layer 33 disposed opposite to each other in the first shielding structure 151 are pre-bonded to each other, and two opposite surfaces of the insulating adhesive layer 33 disposed opposite to each other in the second shielding structure 153 are pre-bonded to each other. Thus, the bent first area 41 and the bent second area 43 are pre-fixed. The bent first area 41 and the bent second area 43 are spaced apart from each other.

In the embodiment, referring to FIG. 4, the first area 41 and the second area 43 are spaced apart from each other.

In some embodiments, referring to FIG. 4, a relative position between the first signal line 131 and the second signal line 133 remains unchanged before and after the bending. In some embodiments, referring to FIG. 5, before and after the bending, a relative position between the first signal line 131 and the second signal line 133 changes. For example, the first signal line 131 and the second signal line 133 are disposed on two opposite planes of the first surface 111 after bending.

Figure 6:
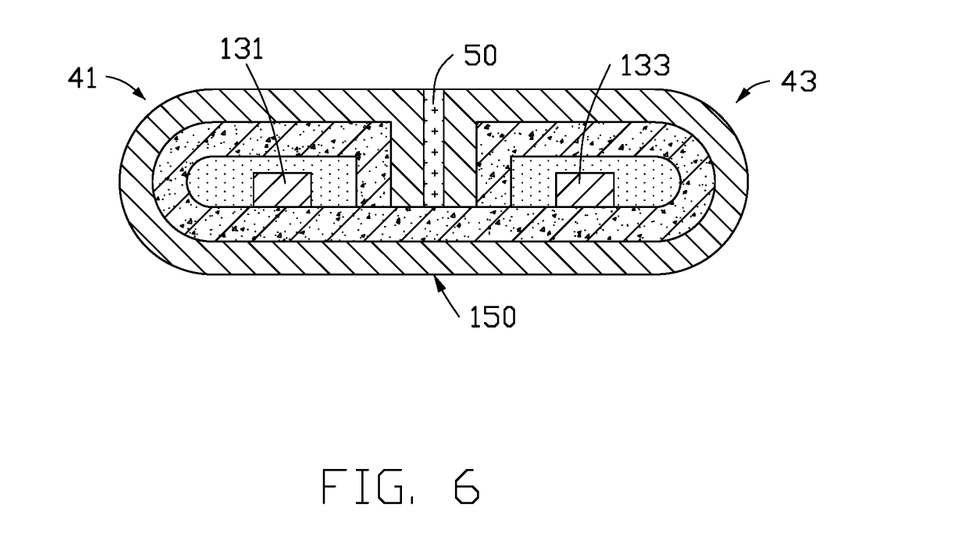
FIG. 6 is a cross-sectional view showing an adhesive layer disposed on the intermediate structure of FIG. 4.
Figure 7:
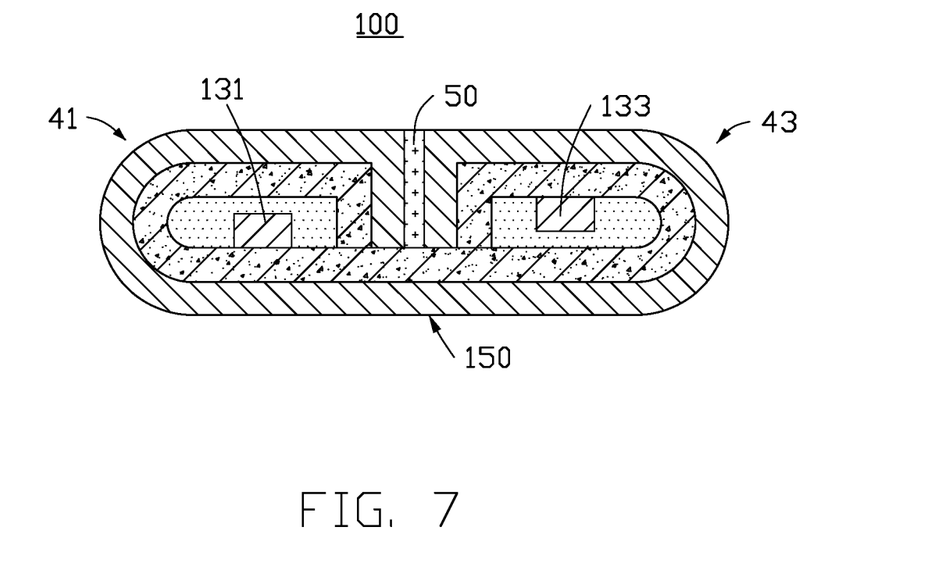
FIG. 7 is a cross-sectional view of an adhesive layer disposed on the intermediate structure of FIG. 5.

In block 4, referring to FIGS. 6 and 7, an adhesive layer 50 is disposed between the bent first area 41 and the bent second area 43 to bond the first area 41 and the second area 43 together. Thereby, the bent first area 41 and the bent second area 43 are fixed.

The adhesive layer 50 may be made of an electrical insulating adhesive or a conductive adhesive. In the embodiment, the adhesive layer 50 is a conductive adhesive, so as to further enhance a shielding effect between the first signal line 131 and the second signal line 133.

In block 5, the intermediate structure 40 with the adhesive layer 50 is pressed to obtain the circuit board 100. The pressed intermediate structure 40 has better structural stability and flat appearance. Furthermore, after pressing, the insulating adhesive layer 33 in the first shielding structure 151 is completely fused, and the insulating adhesive layer 33 in the second shielding structure 153 is completely fused, which further improves the structural stability of the intermediate structure 40. Furthermore, deformation of the circuit board 100 caused by rebound stress at the bent position in the intermediate structure 40 is avoided, and shielding effect between the first signal line 131 and the second signal line 133 is maintained.

Figure 8:
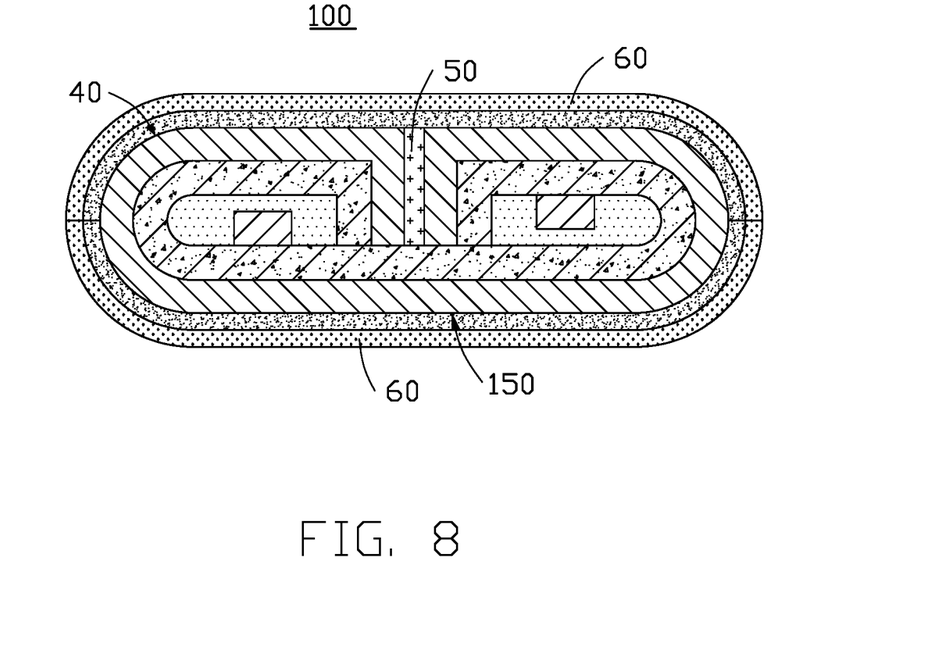
FIG. 8 is a cross-sectional view of a covering film disposed on the intermediate structure of FIG. 7.

In some embodiments, before block 5, referring to FIG. 8, at least one covering film 60 is disposed on an outer surface of the intermediate structure 40 with the adhesive layer 50.

Figure 9:
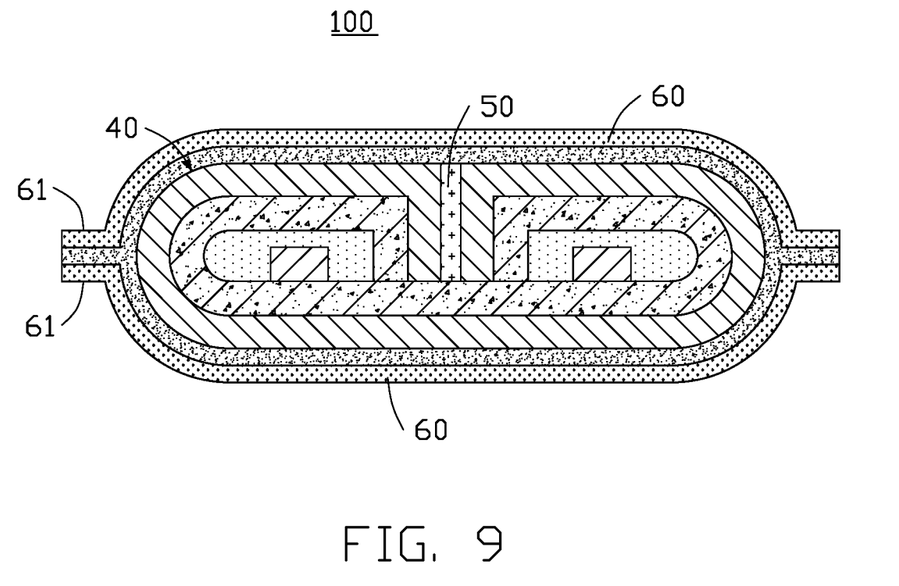
FIG. 9 is a cross-sectional view of another embodiment of a covering film disposed on the intermediate structure of FIG. 6.

Referring to FIG. 8, two covering films 60 are disposed on opposite sides of the intermediate structure 40. The two covering films 60 cover the second surface 150 and are connected to completely cover the outer surface of the intermediate structure 40 with the adhesive layer 50, to protect the intermediate structure 40. In some embodiments, referring to FIG. 9, the two covering films 60 further extend away from the intermediate structure 40 at a junction of the two covering films 60 at the second surface 150 to form extending portions 61. The extending portions 61 of the two covering films 60 are connected to each other. During the pressing in block 5, the extending portions 61 are fused with each other, thereby further facilitating the structural stability of the intermediate structure 40.

Figure 10:
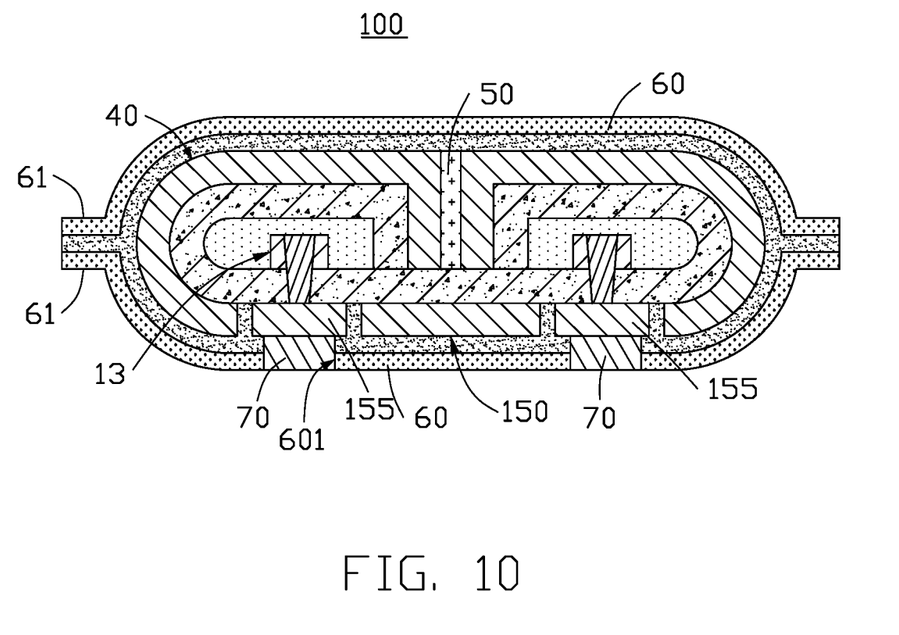
FIG. 10 is a cross-sectional view of a connecting pad disposed on the intermediate structure of FIG. 9.
Figure 11:
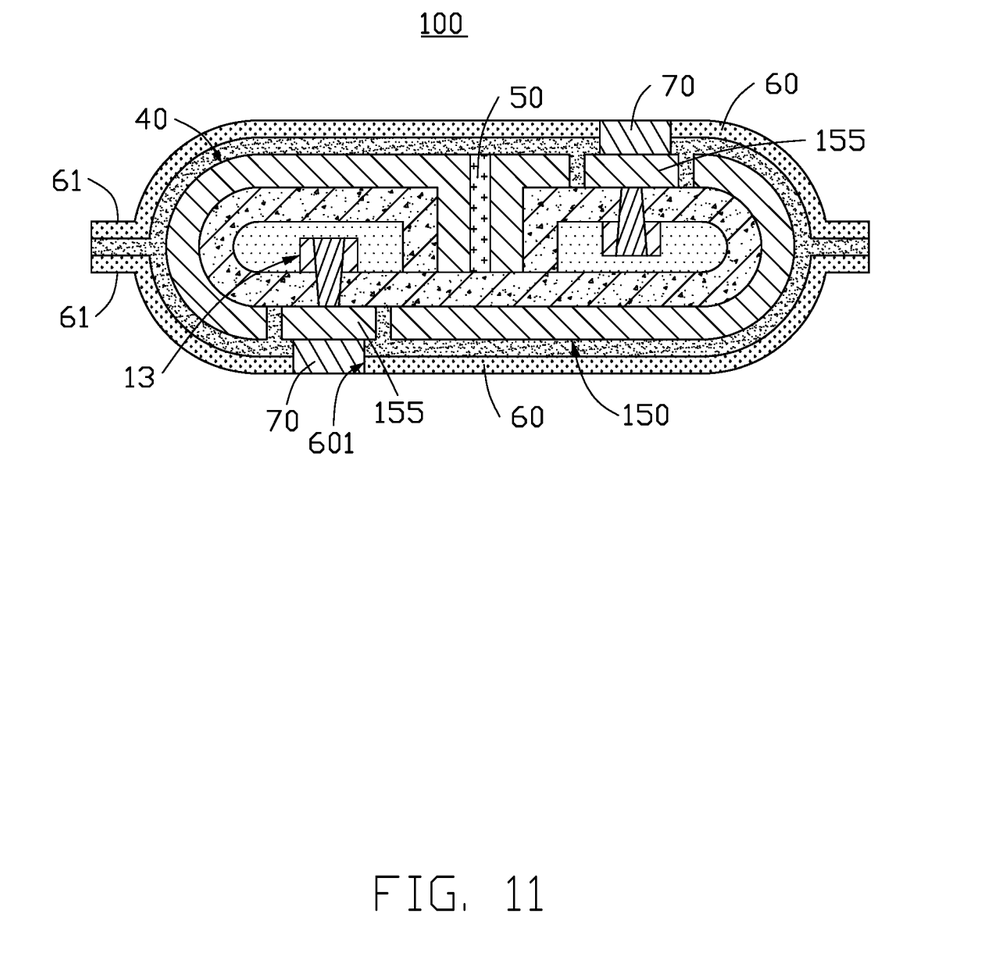
FIG. 11 is a cross-sectional view of a connecting pad disposed on the intermediate structure of FIG. 8.

In some embodiments, referring to FIGS. 10 and 11, the metal layer 15 of the circuit substrate 10 includes at least one connecting pad 155 electrically connected to the circuit layer 13. The covering film 60 defines at least one opening 601, to expose the connecting pads 155.

In some embodiments, after the covering film 60 is disposed, at least one electronic component 70 is disposed on the connecting pads 155.

In some embodiments, the circuit substrate 10 further includes other circuit layers (not shown) disposed between the circuit layer 13 and the metal layer 15, and the other circuit layers are embedded in the dielectric layer 11.

In some embodiments, the block 4 may be omitted.

The method in the present disclosure does not require a laser shielding hole, and the process is simple and easy to operate. The first shielding structure 151 and the second shielding structure 153 are formed by bending, the first shielding structure 151 surrounds the first signal line 131 and the second shielding structure 153 surrounds the second signal line 133. External interference of signals in the circuit board 100 is reduced, and mutual interference between the first signal line 131 and the second signal line 133 is also reduced. At the same time, electromagnetic radiation of the circuit board 100 to the environment is reduced.

Figure 13:
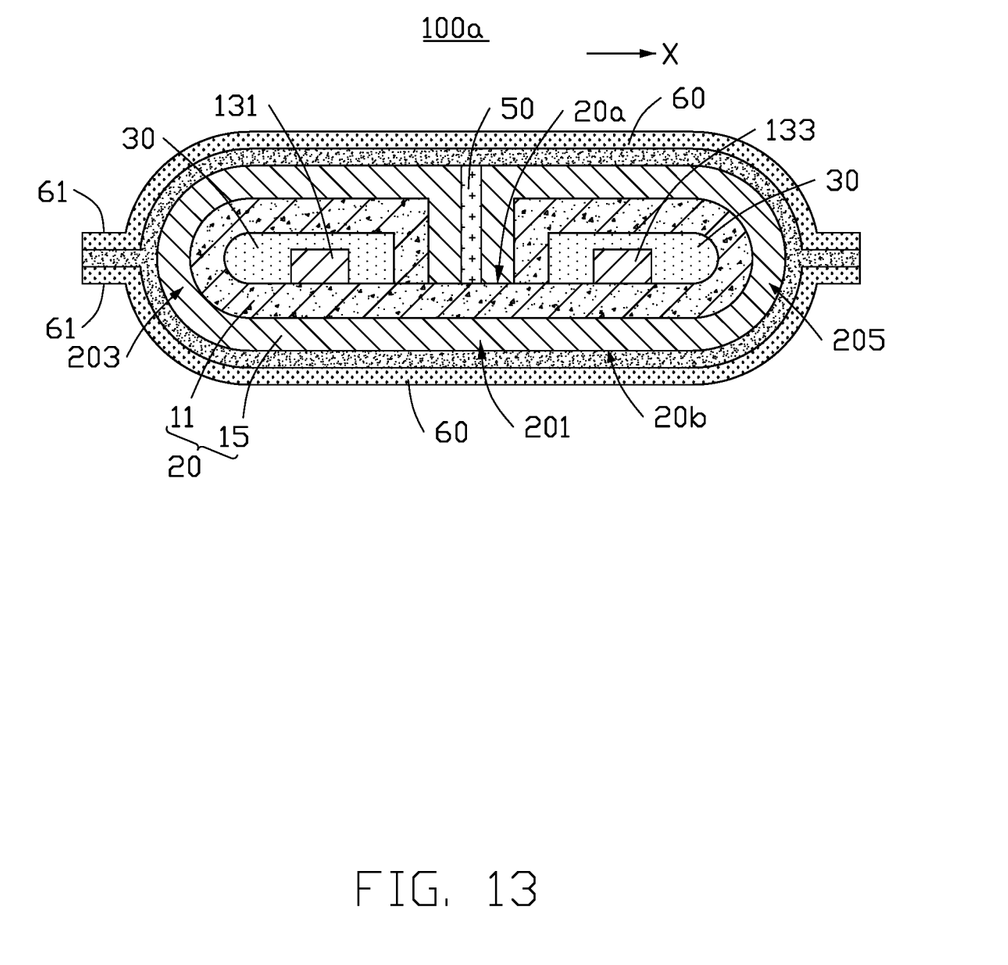
FIG. 13 is a cross-sectional view of another embodiment of a circuit board according to the present disclosure.
Figure 14:
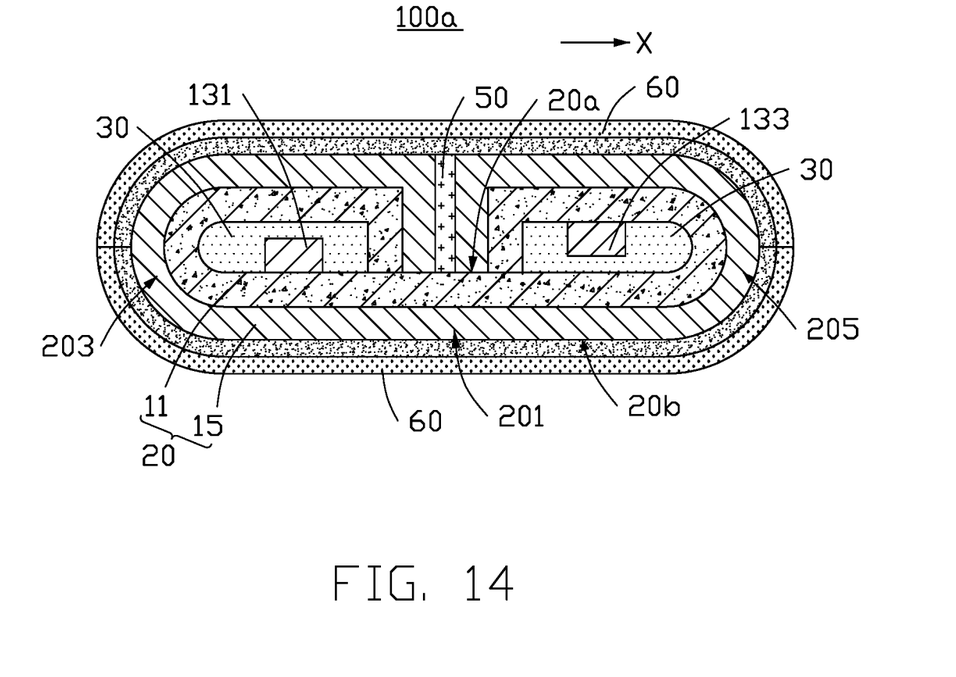
FIG. 14 is a cross-sectional view of yet another embodiment of a circuit board according to the present disclosure.
Figure 15:
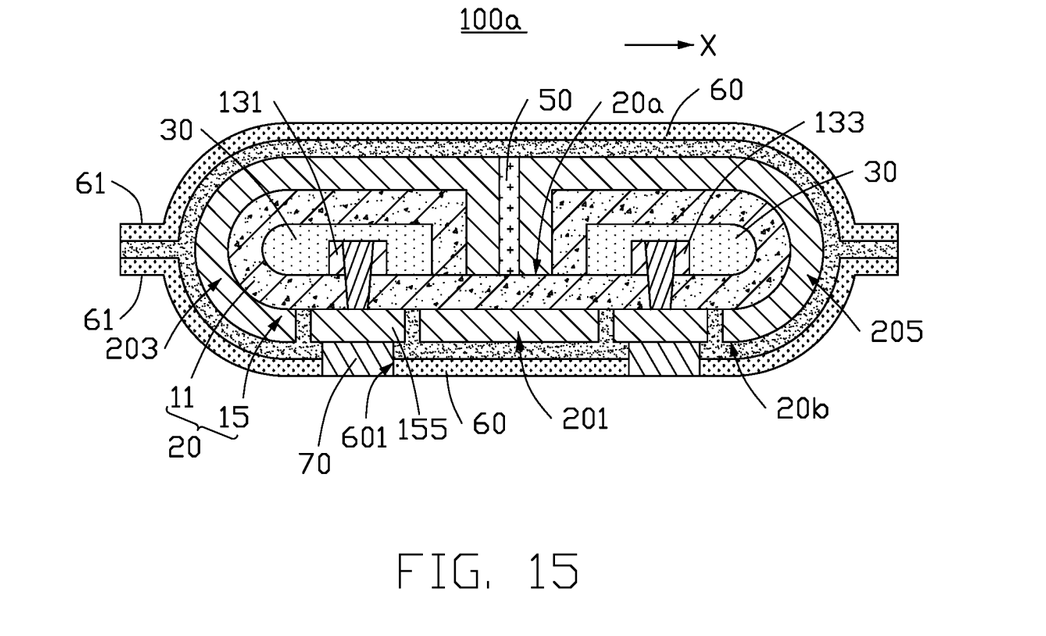
FIG. 15 is a cross-sectional view of yet another embodiment of a circuit board according to the present disclosure.

Referring to FIGS. 13, 14, and 15, a circuit board 100a is further provided. The circuit board 100a includes an electromagnetic shielding film 20, an insulating adhesive portion 30, a first signal line 131, and a second signal line 133. The electromagnetic shielding film 20 includes a first surface 20a and a second surface 20b opposite to each other. The second surface 20b faces outwards. The electromagnetic shielding film 20 includes a main portion 201, a first bent portion 203, and a second bent portion 205 integrally formed. The first signal line 131 and the second signal line 133 are disposed on the first surface 20a and spaced apart from each other along the first direction X. The first bent portion 203 and the second bent portion 205 are connected to opposite sides of the main portion 201 along the first direction X. The first bent portion 203 cooperates with the main portion 201 to surround the first signal line 131. The second bent portion 205 cooperates with the main portion 201 to surround the second signal line 133. The first bent portion 203 and the second bent portion 205 separate the first signal line 131 from the second signal line 133. The insulating adhesive portion 30 fills a gap between the first bent portion 203 and the main portion 201, and a gap between the second bent portion 205 and the main portion 201, thereby fixing the first bent portion 203 and the second bent portion 205 in place.

In some embodiments, referring to FIG. 13, the first signal line 131 and the second signal line 133 are disposed on the main portion 201. In some embodiments, the first signal line 131 is disposed on the first bent portion 203, and/or the second signal line 133 is disposed on the second bent portion 205. Referring to FIG. 14, the first signal line 131 is disposed on the main portion 201, and the second signal line 133 is disposed on the second bent portion 205.

The insulating adhesive portion 30 can be made of at least one of polypropylene, epoxy resin, polyurethane, phenolic resin, urea-formaldehyde resin, melamine-formaldehyde resin, polyimide, and the like.

In some embodiments, the electromagnetic shielding film 20 includes a dielectric layer 11 and a metal layer 15 stacked on the dielectric layer 11. A surface of the dielectric layer 11 facing away from the metal layer 15 is defined as the first surface 20a, and a surface of the metal layer 15 facing away from the dielectric layer 11 is defined as the second surface 20b.

The dielectric layer 11 can be made of polyimide (PI), liquid crystal polymer (LCP), polyethylene terephthalate (PET), or polyethylene naphthalate (PEN). In the embodiment, the dielectric layer 11 is made of polyimide.

The metal layer 15 can be made of copper, silver, nickel, gold, or their alloys.

In some embodiments, the first bent portion 203 and the second bent portion 205 are spaced apart from each other. The circuit board 100a further includes an adhesive layer 50. The adhesive layer 50 is disposed between the first bent portion 203 and the second bent portion 205 and bonds the first bent portion 203 and the second bent portion 205 together, so as to further fix the first bent portion 203 and the second bent portion 205.

The adhesive layer 50 may be made of an electrical insulating adhesive or a conductive adhesive. In the embodiment, the adhesive layer 50 is a conductive adhesive, so as to further enhance an effect of shielding between the first signal line 131 and the second signal line 133.

In some embodiments, referring to FIGS. 13 and 14, the circuit board 100a further includes at least one covering film 60 covering the second surface 20b. Referring to FIG. 14, two covering films 60 cover the second surface 20b, and ends of the two covering films 60 are connected to each other, allowing the two covering films 60 to cooperatively surround the electromagnetic shielding film 20. Referring to FIG. 13, the two covering films 60 extend away from the electromagnetic shielding film 20 at a junction at the second surface 20b, to form extending portions 61. The extending portions 61 of the two covering films 60 are connected to each other, thereby further improving the stability of the circuit board.

In some embodiments, referring to FIG. 15, the metal layer 15 includes at least one connecting pad 155, and the at least one connecting pad 155 is electrically connected to the first signal line 131 or the second signal line 133. When the covering film 60 is provided, the covering film 60 is provided with openings 601 to expose the connecting pads 155.

The circuit board 100a further includes at least one electronic component 70 disposed on connecting pads 155.

The circuit board 100a further includes other circuit layers (not shown) embedded in the dielectric layer 11.

In the circuit board 100a of the present disclosure, the first signal line 131 and the second signal line 133 are surrounded and separated by the electromagnetic shielding film 20. Interference by external signals to signals in the circuit board 100a is reduced, mutual interference between the first signal line 131 and the second signal line 133 is reduced, and at the same time, an electromagnetic radiation of the circuit board 100a to the environment is reduced.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board, comprising:
   an electromagnetic shielding film comprising a first surface and a second surface opposite to each other, the electromagnetic shielding film further comprising a main portion, a first bent portion, and a second bent portion, the second surface facing outwards;
   an insulating adhesive portion;
   a first signal line; and
   a second signal line,
   wherein the first signal line and the second signal line are disposed on the first surface and spaced apart from each other along a first direction, the first bent portion and the second bent portion are connected to opposite sides of the main portion along the first direction; the first bent portion cooperates with the main portion to surround the first signal line, the second bent portion cooperates with the main portion to surround the second signal line, the first bent portion and the second bent portion separate the first signal line from the second signal line; the insulating adhesive portion fills a gap between the first bent portion and the main portion and a gap between the second bent portion and the main portion.

2. The circuit board of claim 1, wherein the electromagnetic shielding film further comprises a dielectric layer and a metal layer stacked on the dielectric layer.

3. The circuit board of claim 2, further comprising at least one covering film covering the second surface.

4. The circuit board of claim 2, wherein the metal layer comprises at least one connecting pad, and the at least one connecting pad is electrically connected to the first signal line or the second signal line.

5. The circuit board of claim 1, wherein the first signal line is disposed on the first bent portion or the main portion, and the second signal line is disposed on the second bent portion or the main portion.

6. The circuit board of claim 5, further comprising at least one covering film covering the second surface.

7. The circuit board of claim 1, wherein the adhesive layer is made of a conductive adhesive.

8. The circuit board of claim 1, further comprising at least one covering film covering the second surface.

9. The circuit board of claim 8, wherein the at least one covering film comprises two covering films, the two covering films covers the second surface and are connected to each other, allowing the two covering films to cooperatively surround the electromagnetic shielding film; the two covering films further extend away from the electromagnetic shielding film at a junction at the second surface to form extending portions, the extending portions of the two covering films are connected to each other.

10. The circuit board of claim 1, further comprising at least one covering film covering the second surface.

11. A method for manufacturing a circuit board, comprising:
    providing a circuit substrate, the circuit substrate comprising a circuit layer, a dielectric layer, and a metal layer stacked in sequence, a surface of the dielectric layer facing away from the metal layer being a first surface, a surface of the metal layer facing away from the dielectric layer being a second surface; the circuit layer comprising a first signal line and a second signal line spaced from each other along a first direction, the first surface comprising an intermediate area, the intermediate area disposed between the first signal line and the second signal line, and the intermediate area spaced apart from the first signal line and the second signal line;
    disposing an insulating adhesive layer on the first surface except for the intermediate area to form an intermediate structure; along the first direction, the intermediate structure comprising a first area on a side of the intermediate area away from the second signal line and a second area on a side of the intermediate area away from the first signal line;

bending the first area and the second area with the metal layer facing outward, so that an end of the first area and an end of the second area are connected to the intermediate area, the metal layer surrounding the first signal line and the second signal line to respectively form a first shielding structure and a second shielding structure; and pressing the intermediate structure to obtain the circuit board.

12. The method of claim 11, wherein a relative position between the first signal line and the second signal line remains unchanged before and after the bending.

13. The method of claim 11, wherein a relative position between the first signal line and the second signal line is changed before and after the bending.

14. The method of claim 11, wherein after the bending, the bent first area and the bent second area are spaced apart from each other.

15. The method of claim 14, wherein before the pressing, the method further comprises:

disposing an adhesive layer between the bent first area and the bent second area to bond the bent first area and the bent second area together.

16. The method of claim 15, wherein the adhesive layer is made of a conductive adhesive.

17. The method of claim 11, wherein before the pressing, the method further comprises:

disposing at least one covering film on an outer surface of the intermediate structure.

18. The method of claim 17, wherein the at least one covering film comprises two covering films, the two covering films covers the second surface and are connected to each other, allowing the two covering films to cooperatively surround the intermediate structure; the two covering films further extend away from the intermediate structure at a junction at the second surface to form extending portions, the extending portions of the two covering films are connected to each other; during the pressing, the extending portions are fused with each other.

19. The method of claim 11, wherein the metal layer comprises at least one connecting pad electrically connected to the circuit layer.

* * * * *